US012754271B2

(12) United States Patent
Zeller

(10) Patent No.: US 12,754,271 B2
(45) Date of Patent: Oct. 6, 2026

(54) CORRECTION OF MOTION EFFECTS IN MAGNETIC RESONANCE (MR) DATA ACQUIRED USING A MAGNETIC RESONANCE SYSTEM

(71) Applicant: Siemens Healthineers AG, Forchheim (DE)

(72) Inventor: Mario Zeller, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 189 days.

(21) Appl. No.: 18/524,260

(22) Filed: Nov. 30, 2023

(65) Prior Publication Data

US 2024/0219503 A1 Jul. 4, 2024

(30) Foreign Application Priority Data

Dec. 30, 2022 (DE) ..................... 10 2022 214 456.2

(51) Int. Cl.
*G01R 33/565* (2006.01)
*G01R 33/483* (2006.01)
*G01R 33/561* (2006.01)

(52) U.S. Cl.
CPC ..... *G01R 33/56509* (2013.01); *G01R 33/483* (2013.01); *G01R 33/4835* (2013.01); *G01R 33/5611* (2013.01)

(58) Field of Classification Search
CPC ............ G01R 33/56509; G01R 33/483; G01R 33/4835; G01R 33/5611
See application file for complete search history.

(56) References Cited

U.S. PATENT DOCUMENTS

2013/0285655 A1* 10/2013 Miyazaki ........... G01R 33/5608 324/309
2018/0095150 A1* 4/2018 Zeller .................. G01R 33/543
(Continued)

OTHER PUBLICATIONS

Setsompop, K. et al. "Improving diffusion MRI using simultaneous multi-slice echo planar imaging" NeuroImage, vol. 63, pp. 569-580, 2012 (Internet: The slice-GRAPPA algorithm (Setsompop et al., 2012) was used to unalias the multiple slices.); 2012.
(Continued)

*Primary Examiner* — Rishi R Patel
(74) *Attorney, Agent, or Firm* — Banner & Witcoff, Ltd.

(57) ABSTRACT

Method including: a) loading sets of multislice MR data acquired simultaneously from identical slices of a subject, the slices are encoded with different phase patterns for each set of multislice MR data; b) separating the sets of multislice MR data into first single-slice MR data of the slices; c) determining slice-specific calibration data for a parallel imaging method for separating simultaneously acquired slices based on the first single-slice MR data; d) using the determined calibration data and an associated parallel imaging method for separating simultaneously acquired slices, separating each of the sets of multislice MR data into second single-slice MR data of the slices; e) determining motion correction parameters based on the second single-slice MR data, for compensating for motion effects between the sets of multislice MR data; and f) determining one motion-corrected set of multislice MR data each per set of multislice MR data using the motion correction parameters.

18 Claims, 2 Drawing Sheets

(56) References Cited

U.S. PATENT DOCUMENTS

| | | | | |
|---|---|---|---|---|
| 2018/0348323 | A1* | 12/2018 | Carinci | G01R 33/3852 |
| 2020/0166594 | A1* | 5/2020 | Carinci | G01R 33/56509 |
| 2022/0130080 | A1 | 4/2022 | Zeller et al. | |

OTHER PUBLICATIONS

Breuer, Felix A. et al.: "Controlled Aliasing in Parallel Imaging Results in Higher Acceleration (Caipirinha) for Multi-Slice Imaging"; in: Magnetic Resonance in Medicine 53: S. 684-691 (2005); 2005.

Cauley, Stephen F. et al. "Interslice Leakage Artifact Reduction Technique for Simultaneous Multislice Acquisitions" Magnetic Resonance in Medicine, vol. 72, pp. 93-102, 2014; 2014.

Setsompop, Kawin, et al. "Blipped?controlled aliasing in parallel imaging for simultaneous multislice echo planar imaging with reduced g?factor penalty." Magnetic resonance in medicine 67.5 (2012): 1210-1224.; 2012.

Kim, Jong-Min, et al.; "Hadamard and Sensitivity Encoding (H-SENSE) for Simultaneous ; Multi-Slice MR Imaging" In: Proceedings of the International Society for Magnetic Resonance in Medicine;23rd Annual Meeting and Exhibition; year: 2015; p. 2407.

Souza, S. P. et al. "SIMA: Simultaneous Multislice Acquisition of MR Images by Hadamard-Encoded Excitation" Journal of Computer Assisted Tomography, vol. 12, No. 6, pp. 1026-1030, 1988; 1988.

Barth, Markus et al., "Simultaneous Multislice (SMS) Imaging Techniques: SMS Imaging";Resonance in Medicine., Bd. 75, Nr. 1, Aug. 26, 2015 (Aug. 26, 2015), pp. 63-81, XP055408927, US ISSN:0740-31; 2015.

* cited by examiner

CORRECTION OF MOTION EFFECTS IN MAGNETIC RESONANCE (MR) DATA ACQUIRED USING A MAGNETIC RESONANCE SYSTEM

TECHNICAL FIELD

The disclosure relates to a correction of motion effects in magnetic resonance (MR) data acquired simultaneously for a plurality of slices using a magnetic resonance system.

BACKGROUND

Independent of the grammatical term usage, individuals with male, female, or other gender identities are included within the term.

Magnetic resonance technology (in the following abbreviation, MR stands for magnetic resonance) is a well-known imaging modality using which images of the interior of an examination subject can be generated. To put it simply, for this purpose the examination subject is positioned in a magnetic resonance device in a comparatively strong static homogeneous basic magnetic field, also known as the $B_0$ field, at field strengths of 0.2 tesla to 7 tesla and more such that the nuclear spins thereof are oriented along the basic magnetic field. In order to trigger nuclear spin resonances measurable as signals, radiofrequency excitation pulses (RF pulses) are radiated into the examination subject, the triggered nuclear spin resonances are measured as what is known as k-space data, and MR images are reconstructed or spectroscopic data determined on the basis thereof. In order to spatially encode the measurement data, rapidly switched magnetic gradient fields, called gradients for short, are superimposed on the basic magnetic field. A scheme used which describes a temporal sequence of RF pulses to be radiated in and gradients to be switched is referred to as a pulse sequence (scheme), or simply as a sequence for short. The recorded measurement data is digitized and stored as complex numeric values in a k-space matrix. An associated MR image can be reconstructed from the k-space matrix populated with values, for example, using a multidimensional Fourier transform.

The desire for ever-faster MR acquisitions in the clinical environment is currently leading to a revival of methods in which multiple images are acquired simultaneously. Generally, these methods can be characterized in that transverse magnetization of at least two slices is used simultaneously for the imaging process in a targeted manner, at least during a part of the measurement ("multislice imaging," "slice multiplexing"). In contrast, in the established multislice imaging technique, the signal of at least two slices is acquired alternately, that is, totally independently of one another, with a correspondingly longer measurement time.

Known methods for this purpose are, for example, the scheme referred to as Hadamard encoding, methods using simultaneous echo refocusing, methods based on broadband data acquisition, or methods that employ parallel imaging in the slice direction. The last-mentioned methods also include, for example, the CAIPIRINHA technique, as described by Breuer et al. in "Controlled Aliasing in Parallel Imaging Results in Higher Acceleration (CAIPIRINHA) for Multi-Slice Imaging," Magnetic Resonance in Medicine 53, 2005, pp. 684-691, and the blipped CAIPIRINHA technique, as described by Setsompop et al. in "Blipped-Controlled Aliasing in Parallel Imaging for Simultaneous Multislice Echo Planar Imaging With Reduced g-Factor Penalty," Magnetic Resonance in Medicine 67, 2012, pp. 1210-1224.

In slice multiplexing methods of the aforesaid type, a pulse referred to as a multiband RF pulse is used to excite or otherwise manipulate, for example, to refocus or saturate, two or more slices simultaneously. In this case, such a multiband RF pulse is, for example, a multiplexing of individual RF pulses, which would be used to manipulate the individual slices that are to be manipulated simultaneously. In order to enable the resulting signals of the different slices to be separated, a different phase in each case is, for example, superimposed on the individual RF pulses prior to the multiplexing, for example, by adding a linear phase ramp as a result of which the slices are shifted relative to one another in position space. As a result of the multiplexing, for example, a baseband-modulated multiband RF pulse is obtained from an addition of the pulse shapes of the individual RF pulses.

As described, for example, in the article by Setsompop et al. already cited above, g-factor penalties can be reduced by shifts between the slices by, for instance, using gradient blips or modulating the phases of the individual RF pulses as appropriate. As likewise described in the cited article by Setsompop et al., but also already in the cited article by Breuer et al., the signals of the simultaneously excited or otherwise manipulated slices can initially be combined as signals of just one slice in order then to be separated in the postprocessing step using a parallel reconstruction method, for example, a (slice) GRAPPA method (GRAPPA: "GeneRalized Autocalibrating Partial Parallel Acquisition") or some other parallel imaging method (PPA), such as, for example, a SENSE method (SENSE: SENSitivity Encoding).

Generally, in order to achieve such a separation of acquired collapsed slices, individually acquired reference data that has been measured, for example, in a prescan, is used for each of the slices.

In slice multiplexing methods using Hadamard encoding (for example, Souza et al., J. CAT 12:1026 (1988)), two (or more) slices are excited simultaneously, a defined signal phase being superimposed on each slice by a corresponding aspect of the RF excitation pulses in order to allow a separation of the simultaneously acquired, and hence collapsed, signals of the simultaneously excited slices to be separated again. In this case, therefore, the slices are encoded using phase modulation of the RF excitation pulses used, as a result of which, in contrast to the aforementioned blipped CAIPIRINHA methods, less stringent requirements are placed on the gradient unit of the magnetic resonance system used. The magnetization signal from each of the two slices is received simultaneously. Similar further excitations of all of the simultaneously excited slices are performed, albeit with changes in each case to the relative signal phase in the slices, until as many similar excitations have been performed (and the generated signals acquired) as slices are excited simultaneously. The rest of the imaging process (for example, phase encoding steps) is performed in the customary manner, while the method can be combined with any acquisition techniques ((multi)gradient echo, (multi)spin echo, etc.)). The signal information of the individual slices can be separated from the acquisitions using suitable computational operations, in particular, using a Hadamard transform along the repetition dimension.

In order to perform a simultaneous acquisition of two slices (1, 2), for example, the method requires two similar excitations (also referred to as repetitions). In the first repetition (A), single-band pulses for slices 1 and 2 can be added for the excitation and subtracted from one another in a second repetition (B). Since the second slice therefore has a 180° phase shift between first and second repetition, the individual slices can already be reconstructed by adding and subtracting the acquired collapsed (multislice) signal information of repetition A and the acquired collapsed (multislice) signal information of repetition B. In the case described, the (single-slice) signal information of slice 1 can be obtained from an addition of the (multislice) signal information of the collapsed slices 1 and 2 of repetition A and the (multislice) signal information of the collapsed slices 1 and 2 of repetition B, and the single-slice signal information of slice 2 can be obtained from a subtraction of the (multislice) signal information of the collapsed slices 1 and 2 of repetition A and the (multislice) signal information of the collapsed slices 1 and 2 of repetition B.

Since multiple excitations of the examined volume are required, an increased sensitivity toward movement between the repetitions results for the Hadamard method. If the slices in the acquisitions of the different repetitions do not make a good match, this can lead to severe image artifacts in the Hadamard separation step.

The method finds application, particularly in low-field systems that have only a low basic magnetic field strength, for example, below 1.5 T, and possibly also do not have high-channel coils at their disposal. In order to increase the signal-to-noise ratio (SNR) for low-field systems of said type, further repetitions of the acquisitions are often necessary, which are intended to be averaged. This leads to an exacerbation of the problem.

A Hadamard method is already known from US 2022/0130080 A1, which method proposes a motion correction based on non-unfolded, that is still present in collapsed form for all simultaneously excited slices, simultaneous acquisitions of multiple slices acquired using a Hadamard encoding scheme. However, the method described there can be applied only to a limited degree to acquisitions that exhibit severe foldover artifacts due, for example, to a movement between different acquisitions.

SUMMARY

An object underlying the disclosure is to enable a simultaneous acquisition of measurement data of multiple slices using a Hadamard method having reduced motion sensitivity without the aforementioned problems.

The object is achieved using a method for correcting motion effects in magnetic resonance (MR) data acquired using a magnetic resonance system according to claim 1, a correction unit according to claim 11, a magnetic resonance system according to claim 12, a computer program according to claim 13, and an electronically readable data medium according to claim 14.

A method according to the disclosure for correcting motion effects in magnetic resonance (MR) data acquired using a magnetic resonance system comprises the steps of:

a) loading at least n, where n>1, sets of multislice MR data, each of which has been acquired simultaneously from n identical slices of an examination subject, wherein the n slices are encoded with different phase patterns for each set of multislice MR data, b) performing a first separation operation which separates the loaded sets of multislice MR data into n first single-slice MR data of the n slices, c) determining slice-specific calibration data for a parallel imaging method for separating simultaneously acquired slices based on the first single-slice MR data, d) performing a second separation operation which, using the determined calibration data and an associated parallel imaging method for separating simultaneously acquired slices, separates each of the loaded sets of multislice MR data into n second single-slice MR data of the n slices, e) determining motion correction parameters based on the second single-slice MR data, which compensate for motion effects between the loaded sets of multislice MR data, f) determining one motion-corrected set of multislice MR data each per loaded set of multislice MR data from the loaded sets of multislice MR data using the determined motion correction parameters.

Using the disclosed determining of calibration data and execution of a separation operation of the individual loaded multislice MR datasets into single-slice MR data per slice and per loaded set of multislice MR data, it is possible according to the disclosure to perform a motion correction specific to each loaded set of multislice MR data (steps e) and f)), using which motion correction the loaded sets of multislice MR data can be brought into agreement in spite of any movement that may have occurred between the respective acquisitions of the sets of multislice MR data. The obtained corrected sets of multislice MR data can consequently be unfolded more effectively in a slice-specific manner. Compared to single-slice MR data obtained from non-corrected sets of multislice MR data, single-slice MR data determined from corrected sets of multislice MR data therefore exhibit fewer to no foldover artifacts.

The image quality of the single-slice MR data can be increased as a result. Furthermore, acquisitions of sets of multislice MR data, which would otherwise possibly have to be discarded due to unduly severe motion effects, can still be used following the correction according to the disclosure, thereby enabling laborious and time-consuming repetitions of the acquisitions to be avoided.

A correction unit according to the disclosure is embodied for performing a method as described herein.

A magnetic resonance system according to the disclosure comprises a magnet unit, a gradient unit, a radiofrequency unit, and a control device embodied for performing a method according to the disclosure and having a correction unit, in particular, a correction unit according to the disclosure.

A computer program according to the disclosure implements a method according to the disclosure on a control device when the program is executed on the control device. For example, the computer program comprises commands which, when the program is executed by a control device, for example, a control device of a magnetic resonance system, cause said control device to perform a method according to the disclosure. The control device can be implemented in the form of a computer.

In this case, the computer program can also be present in the form of a computer program product, which can be loaded directly into a memory of a control device and has program code means to perform a method according to the disclosure when the computer program product is executed in a computing unit of the computing system.

A computer-readable storage medium according to the disclosure comprises commands which, when executed by a control device, for example, a control device of a magnetic resonance system, cause said device to perform a method according to the disclosure.

The computer-readable storage medium can be embodied as an electronically readable data medium on which there is stored electronically readable control information which comprises at least a computer program according to the disclosure and is embodied in such a way that when the data medium is used in a control device of a magnetic resonance system, the control information performs a method according to the disclosure.

The advantages and aspects disclosed in relation to the method also apply analogously to the magnetic resonance system, the computer program product, and the electronically readable data medium.

BRIEF DESCRIPTION OF THE DRAWINGS

Further advantages and details of the present disclosure will become apparent from the exemplary aspects described hereinbelow as well as with reference to the drawings. The cited examples do not constitute any limiting of the disclosure. In the figures.

DETAILED DESCRIPTION

Figure 1:
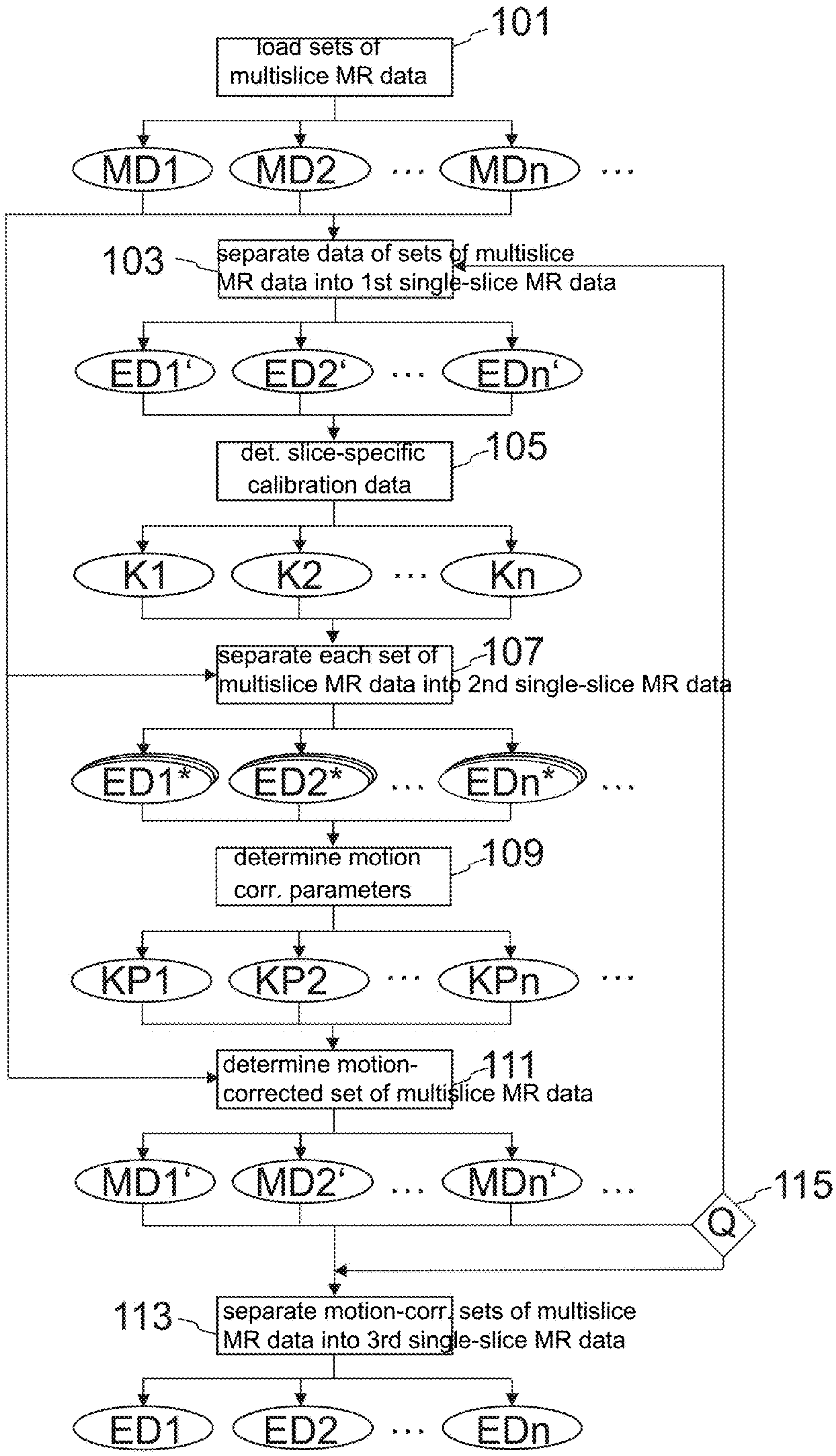
FIG. 1 shows a schematic flowchart of a method according to the disclosure.

FIG. 1 is a schematic flowchart of a method according to the disclosure for correcting motion effects in magnetic resonance (MR) data acquired using a magnetic resonance system.

Here, at least n sets of multislice MR data MD1, MD2, . . . , MDn, . . . are loaded, each of which was acquired simultaneously from n identical slices in each case of an examination subject, wherein the n slices for each set of the multislice MR data MD1, MD2, . . . , MDn, . . . are encoded with different phase patterns (block 101). In this case, the number n>1 applies, that is to say, n is at least two, that is, one set of multislice MR data was acquired simultaneously from at least two slices. The at least n sets of multislice MR data MD1, MD2, . . . , MDn, . . . can be acquired, for example, using a Hadamard encoding scheme in which the phase patterns are superimposed with the multiband RF excitation pulses used. The at least n sets of multislice MR data MD1, MD2, . . . , MDn, . . . can, therefore, be sets of Hadamard acquisitions for simultaneous acquisition of the n slices.

A first separation operation is performed, the data of the loaded sets of multislice MR data MD1, MD2, . . . , MDn, . . . being separated into n first single-slice MR data ED1', ED2', . . . , EDn' of the n slices (block 103).

The first separation operation can, in this case, comprise a Hadamard transform, which reconstructs the single-slice MR data along the dimension of the sets of multislice MR data as is standard practice in Hadamard methods.

It is also conceivable that the first separation operation is applied, not to all data of the loaded sets of multislice MR data, but only to selected parts of the data of the loaded sets of multislice MR data. For example, the first separation operation can be applied only to data from a central region of the k-space, or only to data from regions in the image space which have already been identified using a suitable method as little affected by motion.

Although first single-slice MR data ED1', ED2', . . . , EDn' acquired in this way is reduced in terms of its resolution, it is nonetheless sufficient for use according to the disclosure of first single-slice MR data ED1', ED2', . . . , EDn' as reference data for a subsequent determination of calibration data for a parallel imaging method for separating simultaneously acquired slices.

By such a use of suitable parts of the data of the loaded sets of multislice MR data for the separation into first single-slice MR data, it is possible, on the one hand, to reduce the required computing power. On the other hand, motion effects in first single-slice MR data acquired in such a way can already be reduced as a result.

Furthermore, it is conceivable, in addition or alternatively, that if more than n sets of multislice MR data is loaded, loaded sets of multislice MR data having the same phase pattern are averaged before a first separation operation is performed. Since there are only n different phase patterns, at least one phase pattern must have been used for encoding if more than n sets of multislice MR data are present in at least two of the sets of multislice MR data, which can therefore be averaged.

The first separation operation can therefore comprise an averaging of sets of multislice MR data of further repetitions that have been acquired and loaded in such a way.

Slice-specific calibration data K1, K2, . . . , Kn is determined for a parallel imaging method for separating simultaneously acquired slices based on the first single-slice MR data ED1', ED2', . . . , EDn' (block 105). This process can be carried out using known techniques, as described, for example, in the article by Barth et al., "Simultaneous Multislice (SMS) Imaging Techniques," Magn. Reson. Med., pp. 63-81, 2016. Since one complete k-space is present in each case for determining calibration data K1, K2, . . . , Kn as a result of the at least n sets of multislice MR data of the n slices, a separate acquisition of reference data can be dispensed with.

The slice-specific calibration data K1, K2, . . . , Kn can also be determined from just a subsection of the first single-slice MR data, for example, from a central region in the k-space of the first single-slice MR data transformed into the k-space or from a section of the first single-slice MR data identified as little affected by motion. For this purpose, when the first separation operation has been applied to all the data of the loaded sets of multislice MR data MD1, M2, . . . , MDn, . . . , a corresponding subsection can be selected in the thus obtained first single-slice MR data using corresponding methods (for transformation into the k-space and/or position space or for determining regions little affected by motion).

If the first separation operation has already been applied as described above only to corresponding parts of the data of the loaded sets of multislice MR data MD1, M2, . . . , MDn, . . . , the thus obtained first single-slice MR data ED1', ED2', . . . , EDn' already represents a corresponding subsection, such that the calibration data is already determined from desired subsections.

The slice-specific calibration data can be determined from the first single-slice MR data by, for example, using a slice-GRAPPA method.

Precisely because of the different contrasts due to the different phase patterns of the individual slices in the loaded sets of multislice MR data, it can be further advantageous if the slice-specific calibration data K1, K2, . . . , Kn is determined from the first single-slice MR data ED1', ED2', . . . , EDn' using a method for avoiding slice leaks ("interslice leakage"), as described, for example, in the article by Cauley et al.: "Interslice Leakage Artifact Reduction Technique for Simultaneous Multislice Acquisitions," Magn. Reson. Med., pp. 93-102, 2014.

A second separation operation is performed which, using the determined calibration data K1, K2, . . . , Kn and an associated parallel imaging method for separating simultaneously acquired slices, for example, a slice-GRAPPA method, separates each of the sets of loaded multislice MR data into n second single-slice MR data ED1*, ED2*, . . . , EDn* of the n slices (block 107). Following the second separation operation, n second single-slice MR data ED1*, ED2*, . . . , EDn* in each case is therefore available for each loaded set of multislice MR data MD1, MD2, . . . , MDn, . . . .

The use of the parallel imaging method for separating simultaneously acquired slices enables a repetition-specific unfolding of the n slices, that is an unfolding of the n slices per loaded set of multislice MR data MD1, MD2, . . . , MDn, . . . . Since these separation operations performed using the parallel imaging method for separating simultaneously acquired slices lack the intrinsic averaging of Hadamard methods, the second single-slice MR data ED1*, ED2*, . . . , EDn* has a lower SNR than is usually wanted. However, the obtained second single-slice MR data ED1*, ED2*, . . . , EDn* is less susceptible to motion artifacts compared to averaging separation operations.

Motion correction parameters KP1, KP2, . . . , KPn, . . . are determined for each loaded set of multislice MR data MD1, MD2, . . . , MDn, . . . based on the second single-slice MR data ED1*, ED2*, . . . , EDn*, which parameters compensate for motion effects between the loaded sets of multislice MR data (block 109). Methods for estimating such motion correction parameters KP1, KP2, . . . , KPn, . . . are well-known. In this regard, it is possible to take advantage of the fact that in each case, n slices belonging to a set of multislice MR data ought to have identical motion parameters. This can be incorporated as a boundary condition into the estimation process.

Using the determined motion correction parameters KP1, KP2, . . . , KPn, . . . , one motion-corrected set of multislice MR data MD1', MD2', . . . , MDn', . . . is determined per loaded set of multislice MR data MD1, MD2, . . . , MDn, . . . in each case from the loaded sets of multislice MR data MD1, MD2, . . . , MDn, . . . (block 111). For details of possible options for proceeding in a motion correction method of said type, reference is made to the publication US 2022/0130080 A1 already cited above.

Starting from already determined motion-corrected sets of multislice MR data MD1', MD2', . . . , MDn', . . . , blocks 103 to 111 can be repeated and consequently, in a further iteration, further motion-corrected sets of multislice MR data MD1', MD2', . . . , MDn', . . . can be determined.

In this case, starting from already determined motion-corrected sets of multislice MR data MD1', MD2', . . . , MDn', . . . , blocks 103 to 111 can be repeated until such time as the thus determined further corrected sets of multislice MR data MD1', MD2', . . . , MDn', . . . satisfy a predefined quality metric Q or some other predefined abort criterion, for example, a maximum number of iterations, is reached, which condition can be monitored, for example, using a query 115. A degree of observable remaining artifacts can be chosen, for example, as a quality metric.

An iterative procedure of the aforesaid type can be advantageous, in particular, if the loaded sets of multislice MR data M1, M2, . . . , Mn, . . . are severely corrupted by motion effects such that possibly the determined calibration data is also still affected.

The motion-corrected sets of multislice MR data MD1', MD2', . . . , MDn', . . . can be separated into n third single-slice MR data ED1, ED2, . . . , EDn of the n slices using a third separation operation (block 113).

The third separation operation can, in this case, again comprise a Hadamard transform, which reconstructs the single-slice MR data along the dimension of the sets of multislice MR data as is standard practice in Hadamard methods.

Thanks to the implemented motion correction of the loaded sets of multislice MR data MD1', MD2', . . . , MDn', . . . , third single-slice MR data ED1, ED2, . . . , EDn obtained in the above way is largely free of foldover artifacts and other motion effects and at the same time have a good SNR as a result of the at least n-times acquisition of the n slices in one of the loaded sets of multislice MR data.

The presented method can be applied particularly advantageously in the cases in which a Hadamard method is normally of advantage or even necessary in order, for example, to be able to compensate for a low SNR or a small number of coil channels in the magnetic resonance system. Results of the parallel imaging method used herein for separating multiple simultaneously acquired and hence collapsed slices can generally not adequately compensate for a low SNR and/or small numbers of coil channels, though in this case they are not referred to for a clinical assessment but serve only as a basis for a provisional estimation of motion correction parameters. The described method can successfully reduce the inherent motion susceptibility of Hadamard methods.

The method is especially advantageous more particularly in the case of magnetic resonance systems having low field strength, for example, less than 1.5 tesla, and long acquisition times.

Figure 2:
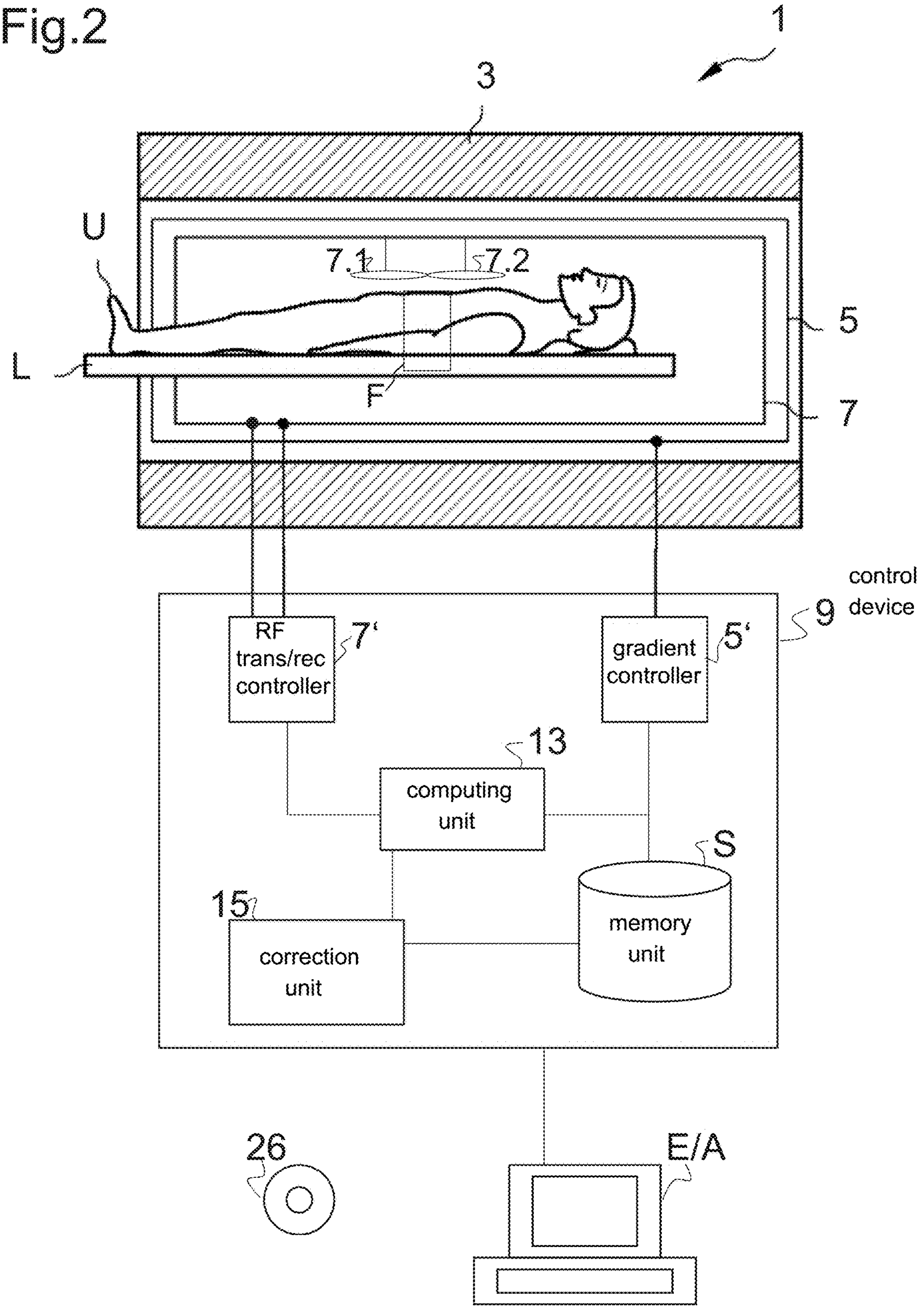
FIG. 2 shows a schematic representation of a magnetic resonance system according to the disclosure with the correction unit.

FIG. 2 shows a schematic representation of a magnetic resonance system 1 according to the disclosure. This comprises a magnet unit 3 for generating the basic magnetic field, a gradient unit 5 for generating the gradient fields, a radiofrequency unit 7 for transmitting and receiving radiofrequency signals, and a control device 9 embodied for performing a method according to the disclosure.

These subordinate units of the magnetic resonance system 1 are represented only in roughly schematic form in FIG. 2. In particular, the radiofrequency unit 7 can consist of several subunits, for example, of a number of coils such as the schematically depicted coils 7.1 and 7.2 or more coils, which can be embodied either only for transmitting radiofrequency signals or only for receiving the triggered radiofrequency signals, or for both.

In order to examine an examination subject U, for example, a patient or a phantom, the subject can be introduced on a couch L into the magnetic resonance system 1 into the measurement volume thereof. The volume F represents an exemplary target volume of the examination subject, which can be subdivided into a plurality of slices and from which the echo signals are to be captured and acquired as measurement data.

The control device 9 serves for controlling the magnetic resonance system 1 and can, in particular, control the gradient unit 5 using a gradient controller 5' and the radiofrequency unit 7 using a radiofrequency transmit/receive controller 7'. In this case, the radiofrequency unit 7 can comprise a number of channels on which signals can be sent or received.

The radiofrequency unit 7 is responsible, together with its radiofrequency transmit/receive controller 7' for generating and radiating (transmitting) a radiofrequency alternating field for manipulating the spins in a region that is to be manipulated (for example, in slices that are to be measured) of the examination subject U. In this case, the center frequency of the radiofrequency alternating field, also referred to as the B1 field, is typically set as far as possible so that it lies close to the resonance frequency of the spins that are to be manipulated. Deviations of the center frequency from the resonance frequency are referred to as off-resonance. In order to generate the B1 field, currents controlled using the radiofrequency transmit/receive controller 7' in the radiofrequency unit 7 are applied to the RF coils.

The control device 9 further comprises a correction unit 15 using which disclosed corrections of sets of multislice MR data can be determined and implemented. The control device 9 is embodied overall to perform a method according to the disclosure. The correction unit 15 may also be embodied independently of the control device 9 and is in any case, embodied for the disclosed loading and processing of sets of multislice MR data.

A computing unit 13 encompassed by the control device 9 is embodied to execute all the computational operations necessary for the required measurements and determinations. Interim results and results required for this purpose or determined in the process can be stored in a memory unit S of the control device 9. The illustrated units are, in this case, not necessarily to be understood as physically separate units but simply represent a subdivision into notional units, yet which can also be realized, for example, in fewer physical units or even in just one single physical unit.

Control commands can be directed, for example, by a user, to the magnetic resonance system and/or results of the control device 9 such as image data can be displayed by way of an input/output device E/A of the magnetic resonance system 1.

A herein-described method can also be available in the form of a computer program that comprises commands that execute the described method on a control device 9. Similarly, a computer-readable storage medium can be available which comprises commands which, when executed using a control device 9 of a magnetic resonance system 1, cause said device to perform the described method.

Independent of the grammatical term usage, individuals with male, female, or other gender identities are included within the term.

The invention claimed is:

1. A computerized method for correcting motion effects in magnetic resonance (MR) data acquired using a magnetic resonance system, the method comprising:

a) loading into a controller at least n, where n>1, sets of multislice MR data, each of which has been acquired simultaneously from n identical slices of an examination subject, wherein the n slices are encoded with different phase patterns for each set of multislice MR data;

b) the controller performing a first separation operation which separates the loaded sets of multislice MR data into n first single-slice MR data of the n slices;

c) the controller determining slice-specific calibration data for a parallel imaging method for separating simultaneously acquired slices based on the first single-slice MR data;

d) the controller performing a second separation operation which, using the determined slice-specific calibration data and an associated parallel imaging method for separating simultaneously acquired slices, separates each of the loaded sets of multislice MR data into n second single-slice MR data of the n slices;

e) the controller determining motion correction parameters based on the second single-slice MR data, which parameters compensate for motion effects between the loaded sets of multislice MR data; and f) the controller determining one motion-corrected set of multislice MR data each per loaded set of multislice MR data from the loaded sets of multislice MR data using the determined motion correction parameters.

2. The computerized method as claimed in claim 1, wherein the first separation operation comprises a Hadamard transform.

3. The computerized method as claimed in claim 1, wherein the first separation operation is applied only to selected parts of the data of the loaded sets of multislice MR data.

4. The computerized method as claimed in claim 1, wherein the first separation operation is applied only to data from a central region of k-space.

5. The computerized method as claimed in claim 1, wherein the first separation operation is applied only to data from regions in image space which have already been identified using a suitable method as less affected by motion than other regions.

6. The computerized method as claimed in claim 1, wherein steps b) to f) are repeated starting from already determined motion-corrected sets of multislice MR data and consequently further motion-corrected sets of multislice MR data are determined.

7. The computerized method as claimed in claim 6, wherein steps b) to f) are repeated starting from already determined motion-corrected sets of multislice MR data until such time as the further motion-corrected sets of multislice MR data satisfy a predefined quality metric or some other predefined abort criterion is met.

8. The computerized method as claimed in claim 1, wherein the motion-corrected sets of multislice MR data are separated using a third separation operation into n third single- slice MR data of the n slices.

9. The computerized method as claimed in claim 1, wherein the slice-specific calibration data is determined from a subsection of the first single-slice MR data.

10. The computerized method as claimed in claim 1, wherein the slice-specific calibration data is determined from a central region in k-space of the first single-slice MR data transformed into the k-space.

11. The computerized method as claimed in claim 1, wherein the slice-specific calibration data is determined from a section of the first single-slice MR data identified as less affected by motion than other regions.

12. The computerized method as claimed in claim 1, wherein the slice-specific calibration data is determined from the first single-slice MR data using a slice-GRAPPA method.

13. The computerized method as claimed in claim 1, wherein the slice-specific calibration data is determined from the first single-slice MR data using a method for avoiding slice leaks.

14. The computerized method as claimed in claim 1, wherein, if more than n sets of multislice MR data are loaded, loaded sets of multislice MR data having the same phase pattern are averaged before a first separation operation is performed.

15. A correction unit operable to perform the computerized method as claimed in claim 1.

16. A magnetic resonance system, comprising:

a magnet unit;

a gradient unit;

a radiofrequency unit; and a controller having a radiofrequency transmit/receive controller and a correction unit, wherein the controller is embodied to perform the method as claimed in claim 1 on the magnetic resonance system.

17. A non-transitory computer program product comprising commands which, when the commands are executed using a controller of a magnetic resonance system, cause the magnetic resonance system to perform the method as claimed in claim 1.

18. A non-transitory computer-readable storage medium comprising commands which, when executed using a controller of a magnetic resonance system, cause the magnetic resonance system to perform the method as claimed in claim 1.

* * * * *